United States Patent
Na et al.

(10) Patent No.: US 10,381,068 B2
(45) Date of Patent: Aug. 13, 2019

(54) ULTRA DENSE AND STABLE 4T SRAM CELL DESIGN HAVING NFETS AND PFETS

(71) Applicant: International Business Machines Corporation, Armonk, NY (US)

(72) Inventors: Myung-Hee Na, Lagrangeville, NY (US); Robert Wong, Poughkeepsie, NY (US); Jens Haetty, Lagrangeville, NY (US); Sean Burns, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/849,367

(22) Filed: Dec. 20, 2017

(65) Prior Publication Data

US 2019/0189195 A1    Jun. 20, 2019

(51) Int. Cl.
| | |
|---|---|
| *G11C 11/412* | (2006.01) |
| *H01L 27/11* | (2006.01) |
| *H01L 27/088* | (2006.01) |
| *G11C 11/419* | (2006.01) |
| *H01L 27/118* | (2006.01) |

(52) U.S. Cl.
CPC .......... *G11C 11/412* (2013.01); *G11C 11/419* (2013.01); *H01L 27/0886* (2013.01); *H01L 27/1108* (2013.01); *H01L 27/11807* (2013.01); *H01L 2027/11812* (2013.01)

(58) Field of Classification Search
CPC ............... G11C 11/412; G11C 11/419; H01L 27/11807; H01L 27/11082; H01L 27/0886; H01L 2027/11812
See application file for complete search history.

(56) References Cited

U.S. PATENT DOCUMENTS

| | | | |
|---|---|---|---|
| 4,813,017 A | 3/1989 | Wong | |
| 6,434,040 B1 * | 8/2002 | Kim ................ | G11C 11/412 |
| | | | 365/154 |
| 6,888,741 B2 * | 5/2005 | Wong .............. | G11C 11/412 |
| | | | 257/298 |
| 6,943,373 B2 | 9/2005 | Takaura et al. | |
| 7,148,522 B2 | 12/2006 | Quek et al. | |
| 8,035,126 B2 | 10/2011 | Nguyen et al. | |
| 8,053,842 B2 | 11/2011 | Masuoka et al. | |
| 9,472,556 B1 | 10/2016 | Ning | |
| 2011/0235444 A1 * | 9/2011 | Chuang ........... | G11C 11/413 |
| | | | 365/189.16 |

(Continued)

OTHER PUBLICATIONS

S.K. Wiedmann et al.. "High-speed split-emitter I/sup 2/L/MTL memory cell," IEEE Journal of Solid-State Circuits, vol. 16, No. 5, Oct. 1981, pp. 429-434.

(Continued)

*Primary Examiner* — David Lam
(74) *Attorney, Agent, or Firm* — Vazken Alexanian; Michael J. Chang, LLC

(57) ABSTRACT

Ultra dense and stable 4T SRAM designs are provided. In one aspect, a 4T SRAM bitcell includes: two NFETs cross-coupled with two PFETs, wherein the NFETs are both connected directly to a word line, wherein a first one of the PFETs is connected to a first bit line via a first one of the NFETs and a second one of the PFETs is connected to a second bit line via a second one of the NFETs, and wherein the PFETs are each separately connected to ground. An SRAM device including the present 4T SRAM bitcell as well as a method of operating the SRAM device are also provided.

20 Claims, 9 Drawing Sheets

(56) References Cited

U.S. PATENT DOCUMENTS

| | | | | |
|---|---|---|---|---|
| 2011/0299349 | A1* | 12/2011 | Deng | G11C 29/50 |
| | | | | 365/201 |
| 2016/0148940 | A1 | 5/2016 | Luan et al. | |
| 2017/0062598 | A1* | 3/2017 | Seo | B82Y 10/00 |
| 2018/0190817 | A1* | 7/2018 | Wu | H01L 29/7827 |

OTHER PUBLICATIONS

K. Noda et al., "A loadless CMOS four-transistor Sram cell in a 0.18-um logic technology," IEEE Transactions on Electron Devices, vol. 48, No. 12, Dec. 2001, pp. 2851-2855.

A.A. Mazreah et al., "A novel four-transistor SRAM cell with low dynamic power consumption," International Journal of Electronics, Circuits and Systems, IJECS, vol. 2, No. 3, 2008, pp. 351-355.

Abhishek Kumar, "SRAM Cell Design with minimum number of Transistor," Proceedings of 2014 RAECS UIET Panjab University Chandigarh (Mar. 2014) (3 pages).

Wiedmann et al., "A 25 ns 8K X 8 Static MTL/I2L RAM," IEEE Journal of Solid-State Circuits, vol. SC-18, No. 5, pp. 486-494 (Oct. 1983).

Fredeman et al., "A 14 nm 1.1 Mb Embedded DRAM Macro With 1 ns Access," IEEE Journal of Solid-State Circuits, vol. 51, No. 1, pp. 230-239 (Jan. 2016).

Lin et al., "High Performance 14nm SOI FinFET CMOS Technology with 0.0174µm2 embedded DRAM and 15 Levels of Cu Metallization," 2014 IEEE International Electron Devices Meeting (Feb. 2015) (3 pages).

Deora et al., "Design of a low power 2T SRAM Cell Using Transmission Gate," International Journal for Advance Research in Engineering and Technology, vol. 2, issue XII, pp. 9-11 (Dec. 2014).

Noda et al., An Ultrahigh-Density High-Speed Loadless Four-Transistor SRAM Macro with Twisted Bitline Architecture and Triple-Well Shield, IEEE Journal of Solid-State Circuits, vol. 36, No. 3, pp. 510-515 (Mar. 2001).

Sugizaki et al., "Ultra High-speed Novel Bulk Thyristor-SRAM (BT-RAM) Cell with Selective Epitaxy Anode (SEA)," 2006 International Electron Devices Meeting (Dec. 2006) (4 pages).

* cited by examiner

US 10,381,068 B2

ULTRA DENSE AND STABLE 4T SRAM CELL DESIGN HAVING NFETS AND PFETS

FIELD OF THE INVENTION

The present invention relates to static random access memory (SRAM) designs, and more particularly, to ultra dense and stable 4T SRAM designs for fin field-effect transistor (FinFET) and beyond including nanosheet and vertical transport field effect transistors (VTFET).

BACKGROUND OF THE INVENTION

With static random access memory (SRAM), stored data is retained as long as the memory is powered. In conventional 6T SRAM designs, each SRAM cell includes six transistors—four for storing data while the other two serve as access transistors.

The incorporation of six transistors per cell is, however, costly in terms of chip density. 6T SRAM designs are not compatible with the scaled technology currently being explored. As such, 4T SRAM cell designs have been proposed for stand-alone SRAM devices.

However, extremely leaky p-channel field effect transistors (PFETs) are needed in the current 4T SRAM designs to retain the cell node. See, for example, Noda et al., "A Loadless CMOS Four-Transistor SRAM Cell in a 0.18-um Logic Technology," IEEE Transactions on Electron Devices, Vol. 48, No. 12 (December 2001). As a result, standby cells can undesirably overwhelm the READ signal Therefore, improved 4T SRAM designs would be desirable.

SUMMARY OF THE INVENTION

The present invention provides ultra dense and stable 4T SRAM designs for fin field-effect transistor (FinFET) and beyond including nanosheet and vertical transport field effect transistors (VTFET). In one aspect of the invention, a 4 transistor (4T) static random access memory (SRAM) bitcell is provided. The 4T SRAM bitcell includes: two n-channel field-effect transistors (NFETs) cross-coupled with two p-channel FETs (PFETs), wherein the NFETs are both connected directly to a word line, wherein a first one of the PFETs is connected to a first bit line via a first one of the NFETs and a second one of the PFETs is connected to a second bit line via a second one of the NFETs, and wherein the PFETs are each separately connected to ground.

In another aspect of the invention, an SRAM device is provided. The SRAM device includes: bit lines; word lines oriented orthogonal to the bit lines; bitcells at an intersection of the word lines and bit lines, wherein each bit cell includes two NFETs cross-coupled with two PFETs, wherein the NFETs are both connected directly to one of the word lines, wherein a first one of the PFETs is connected to a first one of the bit lines via a first one of the NFETs and a second one of the PFETs is connected to a second bit line via a second one of the NFETs, and wherein the PFETs are each separately connected to ground.

In yet another aspect of the invention, a method of operating an SRAM device is provided. The method includes: providing the SRAM device having: bit lines; word lines oriented orthogonal to the bit lines; and bitcells at an intersection of the word lines and bit lines, wherein each bit cell comprises two NFETs cross-coupled with two PFETs, wherein the NFETs are both connected directly to a given one of the word lines, wherein a first one of the PFETs is connected to a first given one of the bit lines via a first one of the NFETs forming a zero (0) node of the 4T SRAM bitcell and a second given one of the PFETs is connected to a second bit line via a second one of the NFETs forming a one (1) node of the 4T SRAM bitcell, and wherein the PFETs are each separately connected to ground; passively retaining the zero (0) node using ground leak through the first PFET; and actively retaining the one (1) node using the second PFET.

A more complete understanding of the present invention, as well as further features and advantages of the present invention, will be obtained by reference to the following detailed description and drawings.

DETAILED DESCRIPTION OF PREFERRED EMBODIMENTS

Provided herein are reduced transistor (i.e., from 6 transistor (6T) to four transistor (4T)) random access memory (SRAM) bitcells which allow for high yield and high density layouts. Each of the present bitcells has two n-channel field-effect transistors (NFETs) and two P-channel FETs (PFETs) with no load resistors. See, for example, 4T SRAM bitcell 100 in FIG. 1.

Figure 1:
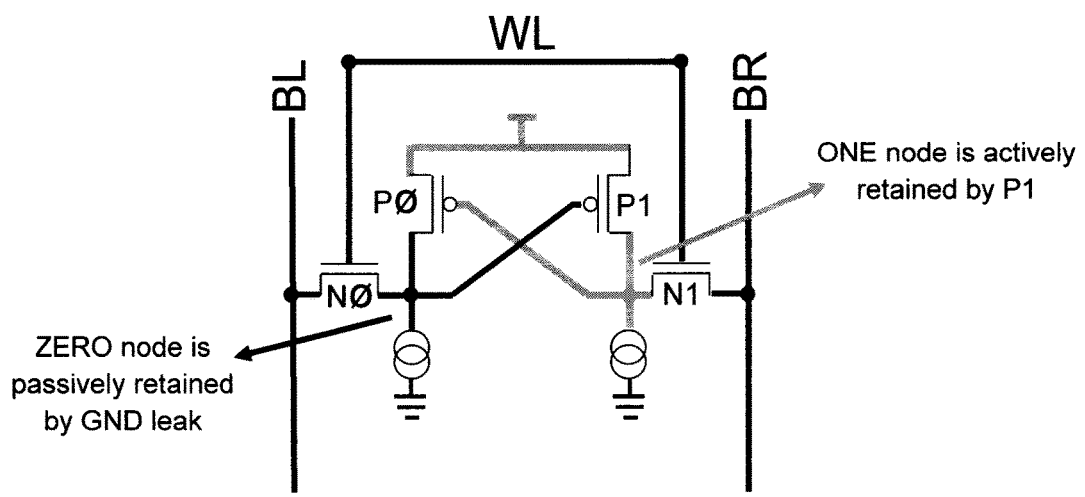
FIG. 1 is a diagram illustrating an exemplary 4 transistor (4T) static random access memory (SRAM) bitcell according to an embodiment of the present invention.

As shown in FIG. 1, 4T SRAM bitcell 100 includes two NFETs (NØ and N1) cross-coupled with two PFETs (PØ and P1), i.e., a first one of the NFETs (NØ) is coupled to a first one of the PFETs (P1) and a second one of the NFETs (N1) is coupled to a second one of the PFETs (PØ). Advantageously, in the present design, the NFETs serve as the word line driver. Namely, as shown in FIG. 1 the NFETs NØ and N1 are both directly connected to the word line (WL). PFET PØ is connected to a first bit line (BL) via NFET NØ, and PFET P1 is connected to a second bit line (BR) via NFET N1. Each of PFETs PØ and P1 are separately connected to ground (GND). The terms BL and BR signify the left and right of the base root cell. In some figures these designations are reversed (i.e., BR appears on the left and BL on the right). This reversal is to indicate the possible mirroring of the root cells when they are placed in the array assembly.

Unlike conventional configurations that use load resistors, the present 4T SRAM bitcells are driven by natural leakage current operation. For instance, as shown in FIG. 1 the zero (0) node is passively retained by ground leakage from PFET PØ, whereas the one (1) node is actively retained by PFET P1.

There are some notable advantages to the present designs. Importantly, the present 4T SRAM bitcell designs permit efficient read operations with minimal access disturbance from the WL activation, and lower standby current. The write, read and standby operations will be described in detail below. Further, the present designs are fully compatible with existing complementary metal-oxide semiconductor (CMOS) process and thus easily integrated with current technology.

Advantageously, as will be described in detail below, the present 4T SRAM designs are fully extendible to finFET architectures and beyond, including nanosheet (NS) and vertical transport field effect transistors (VTFET) which enables SRAM scaling by a half node to a full node (0.5-0.8× area scaling) in these advanced technology architectures.

Figure 2:
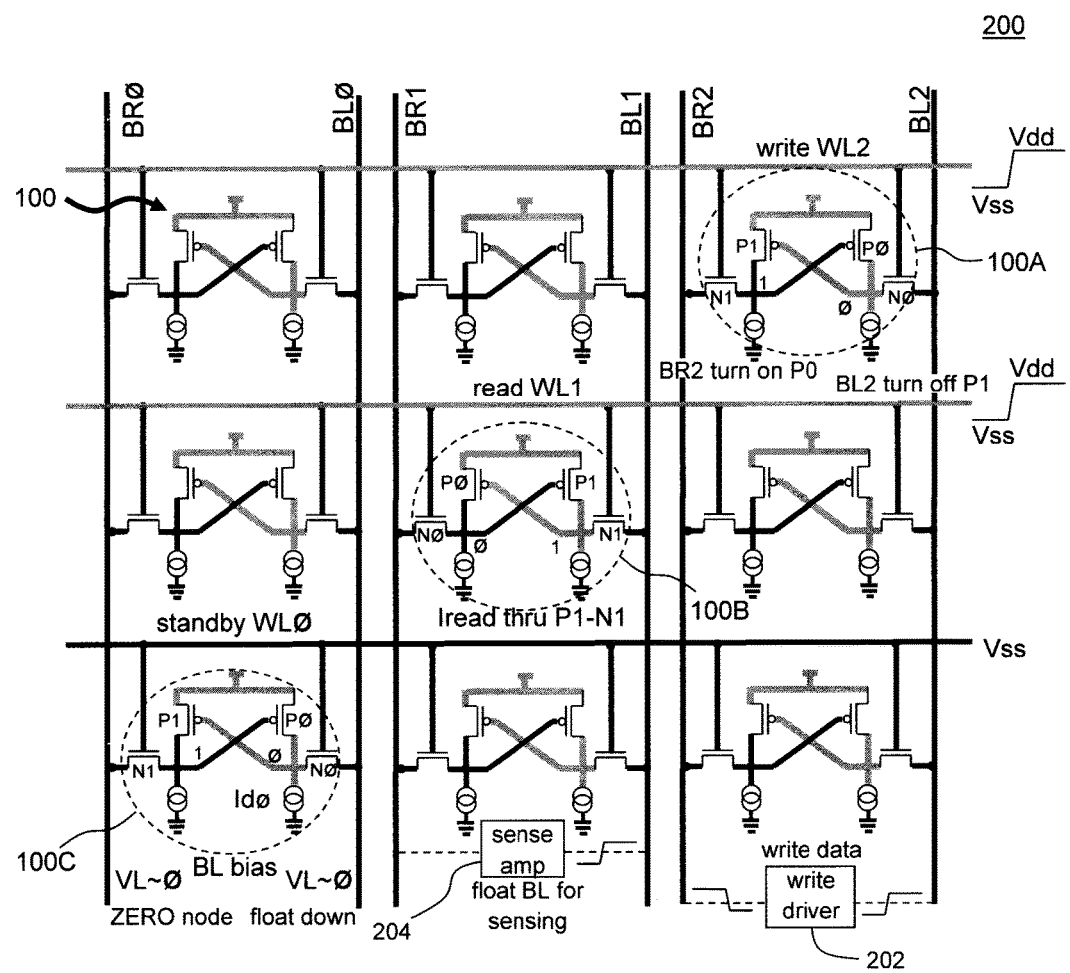
FIG. 2 is a diagram illustrating an array of the present 4T SRAM bitcells according to an embodiment of the present invention.

FIG. 2 is a diagram illustrating an array 200 of the present 4T SRAM bitcells 100. As shown in FIG. 2, the array 200 includes a plurality of word lines (WLs) oriented orthogonal to a plurality of bit lines (BLs). In the array, 4T SRAM bit cells 100 are present at the intersection of a given WL (i.e., WLX) and two of the BLs (i.e., BRX and BLX).

Each bitcell 100 has three different states: write, read and standby. These write, read and standby operations on the array 200 of bitcells 100 are now described by way of reference to FIG. 2 in conjunction with methodology 300 of FIG. 3, methodology 400 of FIG. 4, and methodology 500 of FIG. 5, respectively. The operation of each bitcell 100 is controlled by a given one of the WLs (i.e., WLX) and two of the BLs (i.e., BRX and BLX). See FIG. 2.

Figure 3:
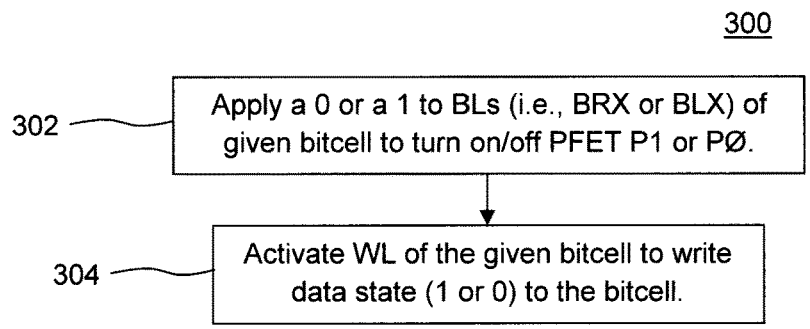
FIG. 3 is a diagram illustrating an exemplary methodology for writing data to a bitcell in the array of FIG. 2 according to an embodiment of the present invention.

Referring to FIG. 2 and methodology 300 of FIG. 3, to write data to a given one of the bitcells 100 (e.g., bitcell 100A) a 0 or a 1 write pulse is applied to the BLs (i.e., BRX or BLX) associated with bitcell 100A. See step 302 of methodology 300. For instance, as shown in the example in FIG. 2, using a write driver 202 to set BR2 to 1 and BL2 to 0 will turn on PØ and turn off P1 (writing a logic 0 to bitcell 100A). Conversely, using the write driver 202 to set BR2 to 0 and BL2 to 1 will turn off PØ and turn on P1 (writing a logic 1 to bitcell 100A).

The WL associated with bitcell 100A is then activated to write the data state (logic 1 or 0) to bitcell 100A. See step 304 of methodology 300. See also FIG. 2 where WL2 is activated.

Figure 4:
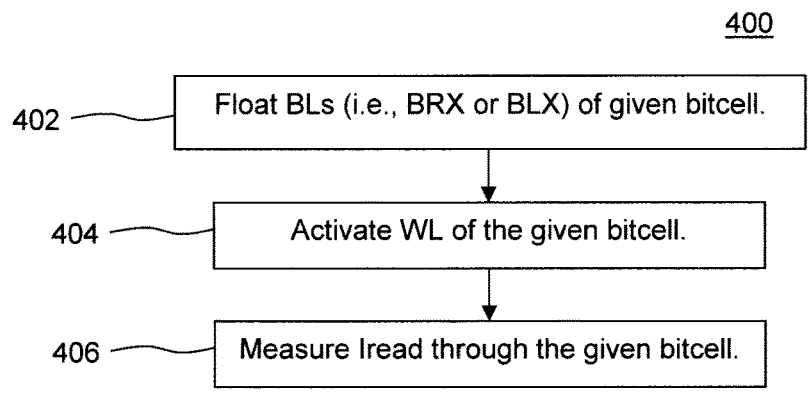
FIG. 4 is a diagram illustrating an exemplary methodology for reading data from a bitcell in the array of FIG. 2 according to an embodiment of the present invention.

Referring to FIG. 2 and methodology 400 of FIG. 4, to read data from a given one of the bitcells 100 (e.g., bitcell 100B) the BLs (i.e., BRX or BLX) associated with bitcell 100A are allowed to float. See step 402 of methodology 400. See also FIG. 2, wherein the BL1 and BR1 associated with bitcell 100B are permitted to float (e.g., by connecting BL1 and BR1 to ground—see below). A floating node refers to the circuit condition when the node is not electrically tied to any voltage level, so that no appreciable current is flowing in or out of the node. For example, the middle of a series of two NFETs would be floating if the two NFET gates are grounded, while the outer terminals are at any random voltage level above ground GND.

The WL associated with bitcell 100B is then activated, e.g., by applying a read voltage=drain-drain voltage (Vdd). See step 404 of methodology 400. See also FIG. 2 where WL1 is activated. The current Iread through the given bitcell 100B is then sensed. See step 406 of methodology 400. For instance, as shown in the example in FIG. 2, a current sense amplifier 204 can be used to read Iread through the bitcell 100B. As is known in the art, a current sense amplifier is a component of SRAM read circuitry typically used to sense and amplify data signals (Iread representative of a logic 1 or 0) from the bit lines of an SRAM array.

In this particular example, PFET P1 is turned on and thus Iread is read through PFET P1 and NFET N1 (i.e., from the BL1 side of the current sense amplifier 204). On the other hand, however, if the PFET PØ is turned on, then Iread would be read through PFET PØ and NFET N2 (from the BR1 side of the current sense amplifier 204).

Figure 5:
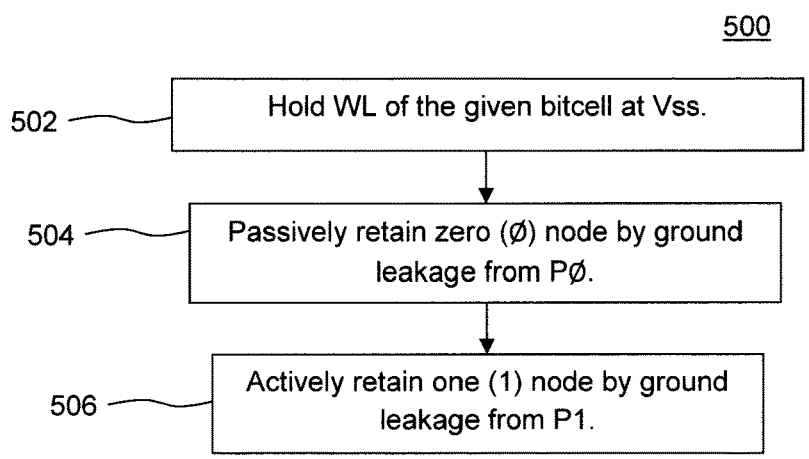
FIG. 5 is a diagram illustrating an exemplary methodology for retaining data in a bitcell in the array of FIG. 2 during standby according to an embodiment of the present invention.

Referring to FIG. 2 and methodology 500 of FIG. 5, to retain the data in a given one of the bitcells 100 (e.g., bitcell 100C) during standby (i.e., when the bitcell 100C is idle) the WL associated with bitcell 100C is not activated. See step 502 of methodology 500. See also FIG. 2 where WLØ is held at source-source voltage (Vss).

In standby, the zero (0) node is passively retained by ground leakage from PFET PØ (see step 504 of methodology 500), and the one (1) node is actively retained by PFET P1 (see step 506 of methodology 500). Standby refers to the cells in the array, where the WL and BL are not active. Generally, in an SRAM array, only one WL is active, meaning that the gate of all cells along that WL are turned on by the active WL that is swept up. Active BL refers to those BLs that are moving up or down for READ or WRITE. IdØ signifies the leakage current to GND from the cell node at VL, low voltage level~GND. BL bias refers to the voltage setting for BL which is NOT active for general SRAM design. Actual bias has no effect on the BIT of the associated SRAM cells as long as the WL is inactive shutting off all of the gates. VL refers to the low level of the flip flop that is lower than VH of the high node. Ideally VL is GND. General VH is Vdd.

Figure 6:
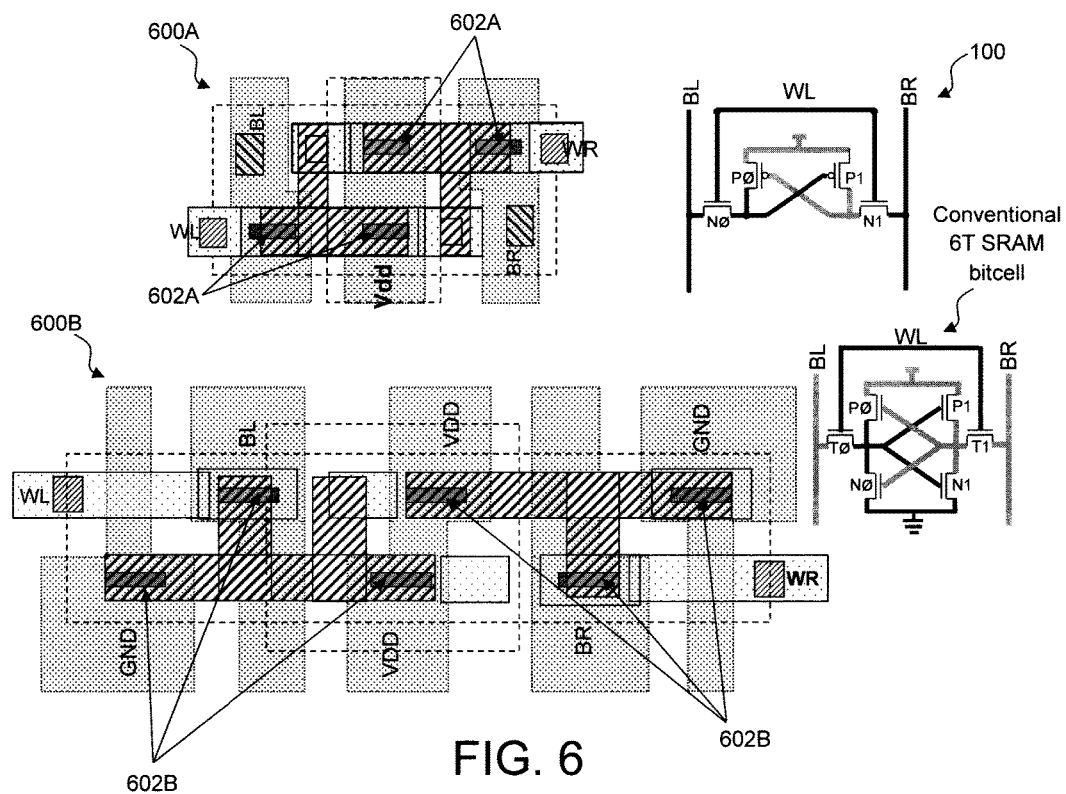
FIG. 6 is a top-down diagram illustrating a first exemplary layout of the present 4T SRAM bitcell design implemented with 4 vertical transport field effect transistors (VFETs) as compared to a conventional 6T design according to an embodiment of the present invention.

As highlighted above, the present 4T SRAM designs can be extended to finFET technology nodes and beyond which enables SRAM scaling by a half node to a full node (0.5-0.8× area scaling) in these advanced technology architectures. By way of example only, FIG. 6 is a top-down diagram illustrating an exemplary layout 600A of the present 4T SRAM bitcell design implemented with (4) VTFETs as compared to a conventional 6T design as shown in layout 600B. For reference, the circuit diagrams of the present 4T SRAM bitcell 100 and a conventional 6T SRAM bitcell are shown to the right of layouts 600A and 600B, respectively.

Referring first to layout 600A, as described above, the present 4T SRAM bitcell is located at the intersection of a WL and two BLs (i.e., BL and BR) and in this particular example includes four VFETs 602A, two of which are NFETs and the other two PFETs.

By comparison, the 6T design shown in layout 600B includes four VFETs 602B, i.e., two NFETs, two PFETs and two access transistors (NFET or PFET—labeled T0 and T1). An area scaling of ~0.48× for the present 4T bitcell SRAM VTFET layout 600A over the conventional 6T bitcell SRAM VTFET layout 600B is achieved.

Figure 7:
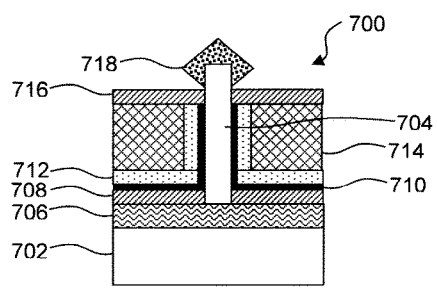
FIG. 7 is a diagram illustrating an exemplary VTFET that can be implemented as the NFETs and/or PFETs in the present 4T SRAM bitcell design according to an embodiment of the present invention.

FIG. 7 is a diagram illustrating an exemplary VTFET 700 that can be implemented as the NFETs and/or PFETs in the present 4T SRAM bitcell design. VTFETs are transistors that are oriented vertically with a fin channel disposed on top of a bottom source and drain, and a top source and drain disposed on top of the vertical fin channel. A gate is present alongside the vertical fin channel.

Namely, as shown in FIG. 7, VFET 700 includes at least one vertical fin channel 704 patterned in a substrate 702 (e.g., a silicon (Si), germanium (Ge), silicon germanium (SiGe), etc. substrate). According to an exemplary embodiment, the vertical fin channel 704 is undoped. A bottom source and drain 706 is present at the base of the vertical fin channel 704. Bottom spacers 708 are disposed on the bottom source and drain 706. The bottom spacers 708 (and counterpart top spacers to be formed at the top of the vertical fin channel 704) serve to offset the gate from the bottom and top source and drains, respectively.

A gate (i.e., a gate dielectric and a gate conductor) is then formed along the sidewalls of the vertical fin channel 704 over the bottom spacers 708. According to an exemplary embodiment, the gate includes a conformal gate dielectric 710 deposited onto the vertical channel 704 and the bottom spacers 708, and a conformal gate conductor 712 deposited onto the conformal gate dielectric 710.

According to an exemplary embodiment, a metal gate is formed wherein the conformal gate conductor 712 is a metal or combination of metals and the conformal gate dielectric 710 is a high-κ dielectric. For instance, the gate conductor 712 is a workfunction setting metal. The particular workfunction metal employed can vary depending on whether an n-type or p-type transistor is desired. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide (HfO$_2$) rather than 4 for silicon dioxide). Suitable high-κ gate dielectrics include, but are not limited to, HfO$_2$ and/or lanthanum oxide (La$_2$O$_3$).

A gap fill material 714 surrounds the gate (thereby permitting selective processing at the top of the vertical fin channel 704). As shown in FIG. 7, the conformal gate dielectric 710 and conformal gate conductor 712 are recessed at the top of the vertical fin channel 704, and top spacers 716 are disposed above the gate at the top of the vertical fin channel 704. A top source and drain 718 is present above the top spacers 716.

The bottom and top source and drains 706 and 718 are doped with either an n-type or p-type dopant depending on whether a p-channel VTFET or an n-channel VTFET is required. Suitable n-type dopants include, but are not limited to, phosphorous and arsenic, and suitable p-type dopants include, but are not limited to, boron. Thus, based on the dopants employed, VTFET 700 can be configured to serve as the NFET and/or PFET transistors in the present 4T SRAM bitcell.

Figure 8:
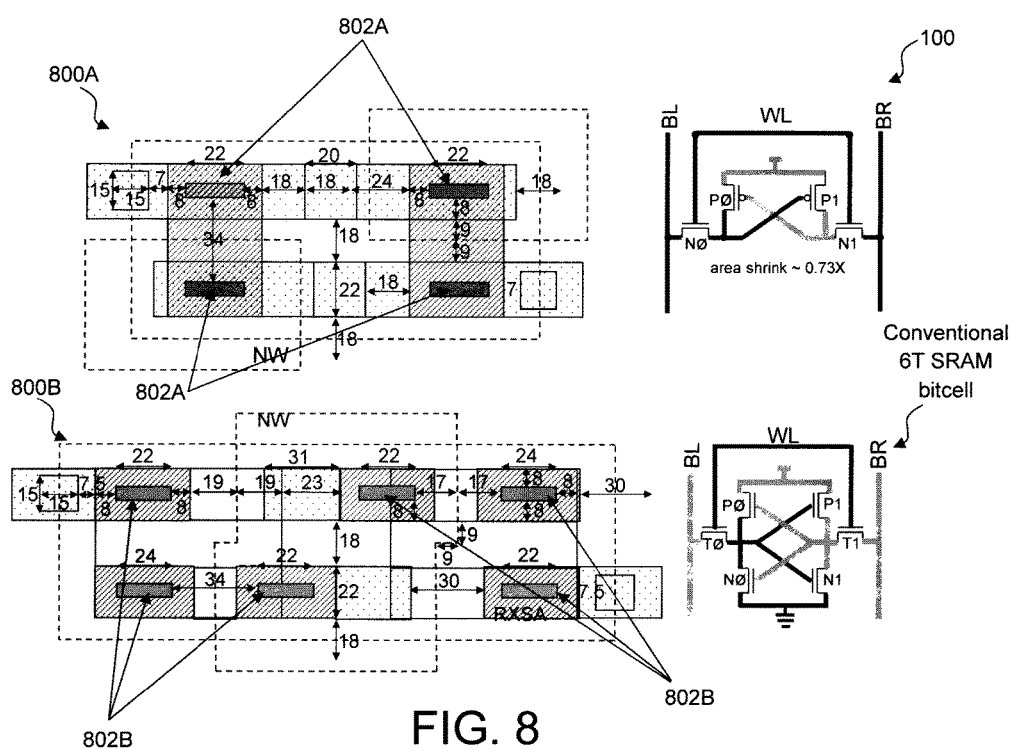
FIG. 8 is a top-down diagram illustrating a second exemplary layout of the present 4T SRAM bitcell design implemented with 4 VFETs as compared to a conventional 6T design according to an embodiment of the present invention.

Further area scaling can be achieved in VTFET technology by aligning the VTFETs. See, for example, FIG. 8. FIG. 8 is another version of a VTFET SRAM configuration where the cell node cross-couple is made on the bottom source and drain of the vertical FET. Bit lines BL/BR run on metal level (M1) over the top of the VTFET. FIG. 6 (described above) is the other version where the cell node cross-couple is made on the top source and drain of the VTFET, while the bit lines BL/BR run on the contact connecting the bottom source and drain of the VTFET. By way of example only, FIG. 8 is a top-down diagram illustrating an exemplary layout 800A of the present 4T SRAM bitcell design implemented with (4) VTFETs as compared to a conventional 6T design as shown in layout 800B. As above, as a point of reference, the circuit diagrams of the present 4T SRAM bitcell 100 and a conventional 6T SRAM bitcell are shown to the right of layouts 800A and 800B, respectively.

Referring first to layout 800A, the 4T SRAM bitcell in this particular example includes four VFETs 802A, two of which are NFETs and the other two PFETs. By comparison, the 6T design shown in layout 800B includes four VFETs 802B, i.e., two NFETs, two PFETs and two access transistors (NFET or PFET). An area scaling of ~0.73× for the present 4T bitcell SRAM VTFET layout 800A over the conventional 6T bitcell SRAM VTFET layout 800B is achieved.

Figure 9:
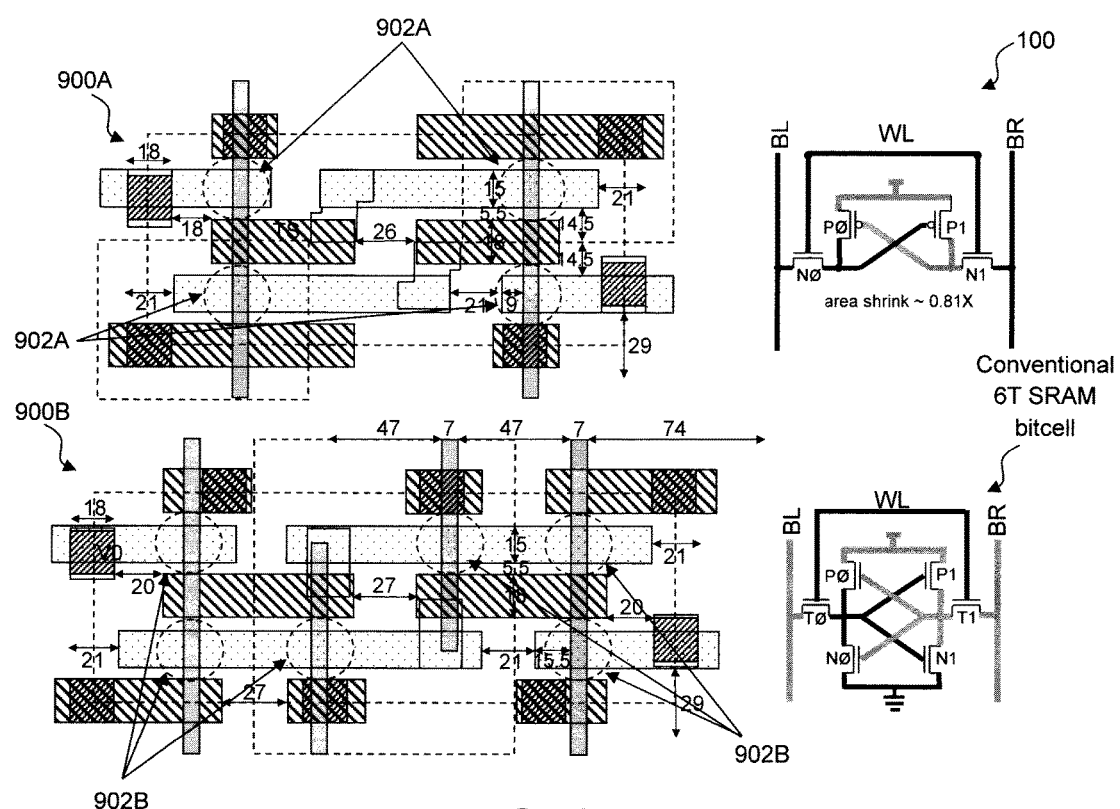
FIG. 9 is a top-down diagram illustrating an exemplary layout of the present 4T SRAM bitcell design implemented with 4 fin field-effect transistor (finFETs) as compared to a conventional 6T design according to an embodiment of the present invention.

In accordance with the present techniques, area scaling can also be achieved via the present 4T SRAM bitcell designs being implemented in finFET technology. By way of example only, FIG. 9 is a top-down diagram illustrating an exemplary layout 900A of the present 4T SRAM bitcell design implemented with (4) finFETs as compared to a conventional 6T design as shown in layout 900B. As a point of reference, the circuit diagrams of the present 4T SRAM bitcell 100 and a conventional 6T SRAM bitcell are shown to the right of layouts 900A and 900B, respectively.

Referring first to layout 900A, the 4T SRAM bitcell in this particular example includes four finFETs 902A, two of which are NFETs and the other two PFETs. By comparison, the 6T design shown in layout 900B includes four finFETs 902B, i.e., two NFETs, two PFETs and two access transistors (NFET or PFET). An area scaling of ~0.81× for the present 4T bitcell SRAM finFET layout 900A over the conventional 6T bitcell SRAM VTFET layout 900B is achieved.

Figure 10:
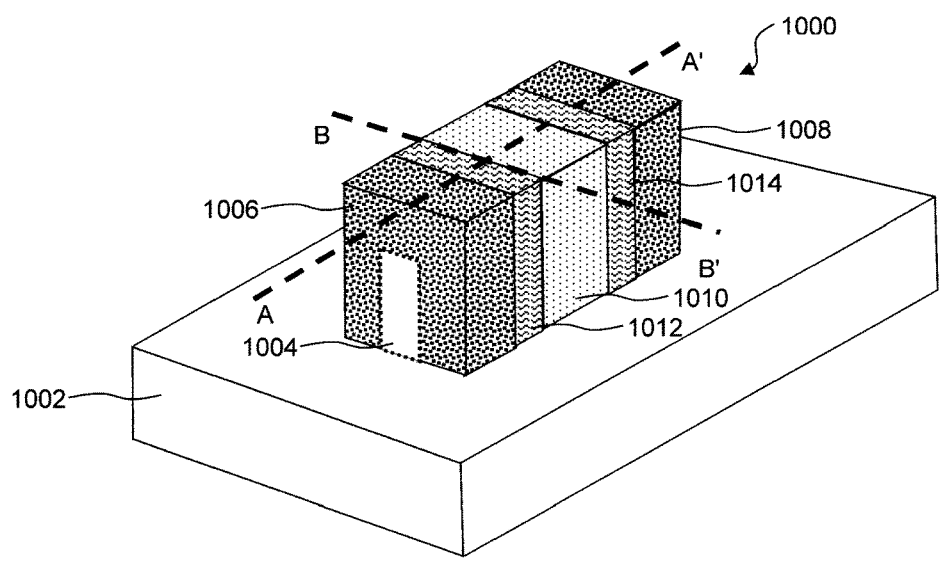
FIG. 10 is a three-dimensional diagram illustrating an exemplary finFET that can be implemented as the NFETs and/or PFETs in the present 4T SRAM bitcell design according to an embodiment of the present invention.
Figure 11:
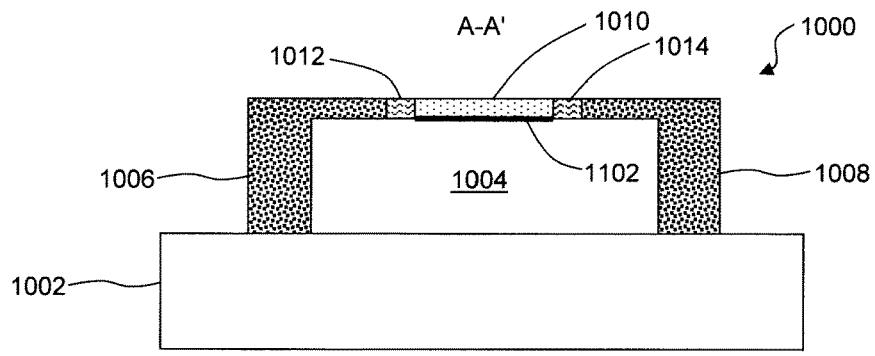
FIG. 11 is a cross-sectional view of the exemplary finFET of FIG. 10 according to an embodiment of the present invention.
Figure 12:
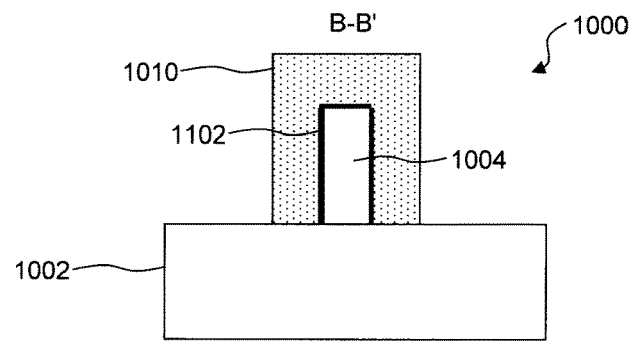
FIG. 12 is another cross-sectional view of the exemplary finFET of FIG. 10 according to an embodiment of the present invention.

FIGS. 10-12 are diagrams illustrating an exemplary finFET 1000 that can be implemented as the NFETs and/or PFETs in the present 4T SRAM bitcell design. FinFETS are transistors having a fin-shaped channel interconnecting a source and a drain. A gate is present over the fin-shaped channel.

Namely, as shown in FIG. 10, finFET 1000 includes at least one fin 1004 patterned in a substrate 1002 (e.g., a Si, Ge, SiGe, etc. substrate). The fin 1004 serves as a channel interconnecting a source 1006 and a drain 1008. A gate is present over the channel (i.e., the channel is the portion of the fin 1004 under the gate). The gate includes a gate conductor 1010 and a gate dielectric (not visible in this depiction) that separates the gate conductor 1010 from the channel. The gate is offset from the source 1006 and drain 1008 by spacers 1012 and 1014, respectively.

The source 1006 and drain 1008 are doped with either an n-type or p-type dopant depending on whether a p-channel VTFET or an n-channel VTFET is required. Suitable n-type dopants include, but are not limited to, phosphorous and arsenic, and suitable p-type dopants include, but are not limited to, boron. Thus, based on the dopants employed, finFET 1000 can be configured to serve as the NFET and/or PFET transistors in the present 4T SRAM bitcell.

Different cross-sectional views through the finFET 1000 are provided. For instance, FIG. 11 depicts a cross-sectional cut A-A' (see FIG. 10) along the fin 1004. As shown in FIG. 11, the fin 1004 extends between the source 1006 and drain 1008. The gate conductor 1010 is present over a portion of the fin 1004 that serves as the channel of the finFET 1000. As shown in FIG. 11, a gate dielectric 1102 separates the gate conductor 1010 from the channel.

By way of example only, suitable gate conductors 1010 include, but are not limited to, doped poly-silicon (poly-Si), a workfunction setting metal(s), or combinations thereof. As provided above, suitable n-type workfunction setting metals include, but are not limited to, TiN, TaN and/or Al-containing alloys such as TiAl, TiAlN, TiAlC, TaAl, TaAlN, and/or TaAlC. Suitable p-type workfunction setting metals include, but are not limited to, TiN, TaN, and W.

A silicon dioxide ($SiO_2$) gate dielectric 1102 is well suited for a poly-Si gate conductor 1010, while a high-κ gate dielectric 1102 is preferable for a metal gate conductor 1010. As provided above, suitable high-κ gate dielectrics include, but are not limited to, $HfO_2$ and/or $La_2O_3$.

FIG. 12 depicts a cross-sectional cut B-B' (see FIG. 10) through the fins 1004, in between the spacer 1012 and the gate. As shown in FIG. 12, the gate (i.e., gate dielectric 1102 and gate conductor 1010) are present along the sidewalls and top of the fin 1004. As provided above, the portion of the fin 1004 covered by the gate (i.e., gate dielectric 1102 and gate conductor 1010) is the channel of the finFET 1000.

Figure 13:
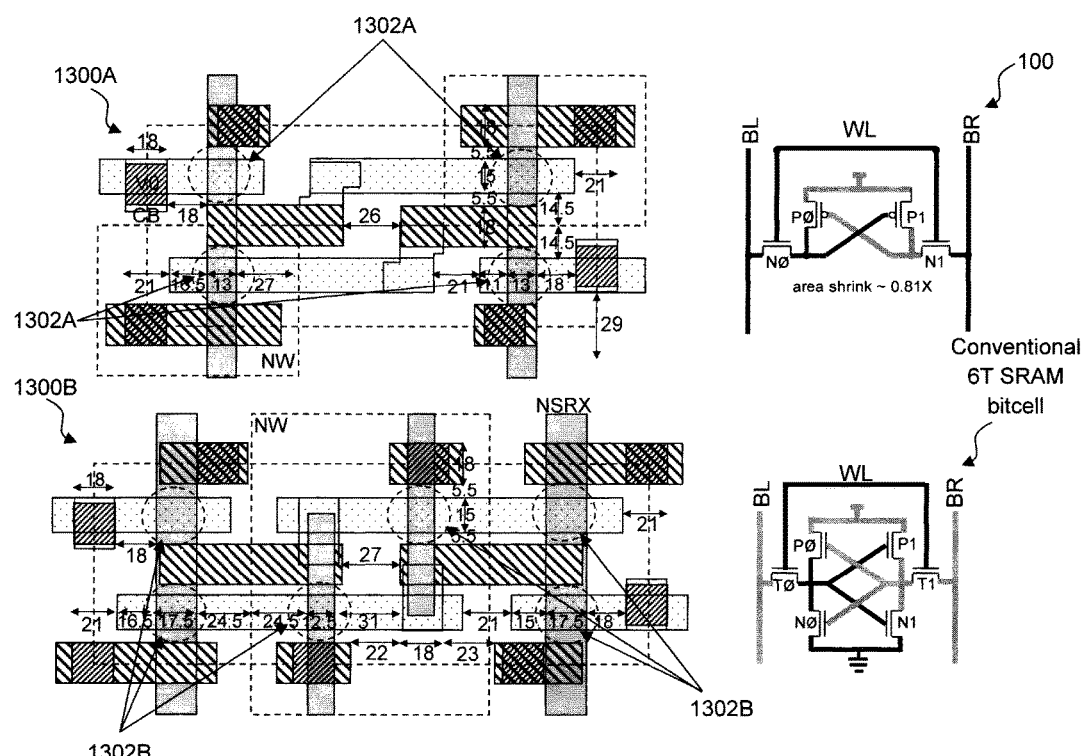
FIG. 13 is a top-down diagram illustrating an exemplary layout of the present 4T SRAM bitcell design implemented with 4 nanosheet transistors as compared to a conventional 6T design according to an embodiment of the present invention.

Area scaling can also be achieved with the present 4T SRAM bitcell designs being implemented in nanosheet technology. The term nanosheet, as used herein, refers to a sheet or a layer having nanoscale dimensions. Further, the term nanosheet may also be used interchangeably herein with the term nanowire. For instance, nanosheet can be used to refer to a nanowire with a larger width, and/or nanowire may be used to refer to a nanosheet with a smaller width, and vice versa. By way of example only, FIG. 13 is a top-down diagram illustrating an exemplary layout 1300A of the present 4T SRAM bitcell design implemented with (4) nanosheet (NS) transistors as compared to a conventional 6T design as shown in layout 1300B. As a point of reference, the circuit diagrams of the present 4T SRAM bitcell 100 and a conventional 6T SRAM bitcell are shown to the right of layouts 1300A and 1300B, respectively.

Referring first to layout 1300A, the 4T SRAM bitcell in this particular example includes four nanosheet transistors 1302A, two of which are NFETs and the other two PFETs. By comparison, the 6T design shown in layout 1300B includes four nanosheet transistors 1302B, i.e., two NFETs, two PFETs and two access transistors (NFET or PFET). An area scaling of ~0.81× for the present 4T bitcell SRAM nanosheet layout 1300A over the conventional 6T bitcell SRAM VTFET layout 1300B is achieved.

Figure 14:
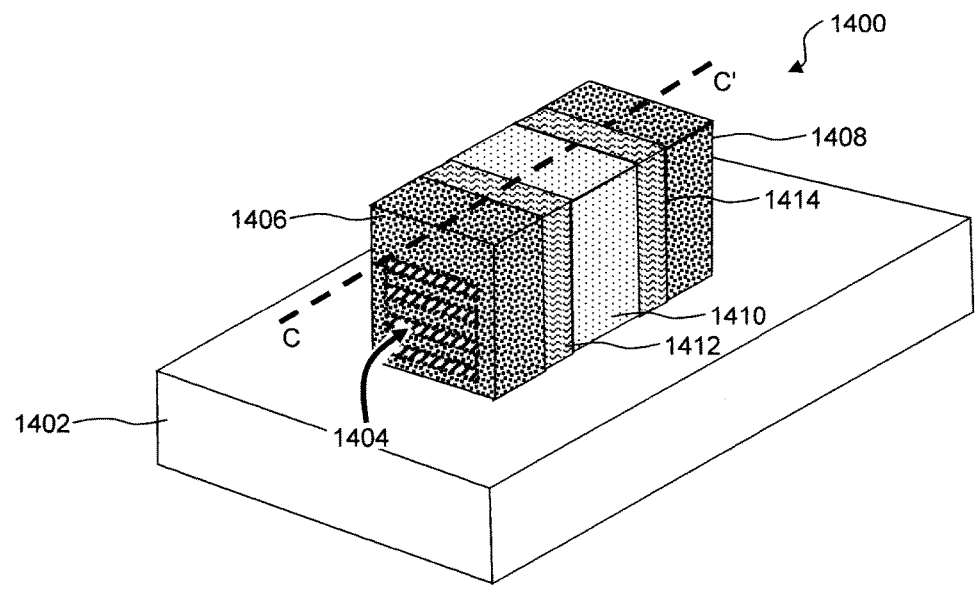
FIG. 14 is a three-dimensional diagram illustrating an exemplary nanosheet transistor that can be implemented as the NFETs and/or PFETs in the present 4T SRAM bitcell design according to an embodiment of the present invention.
Figure 15:
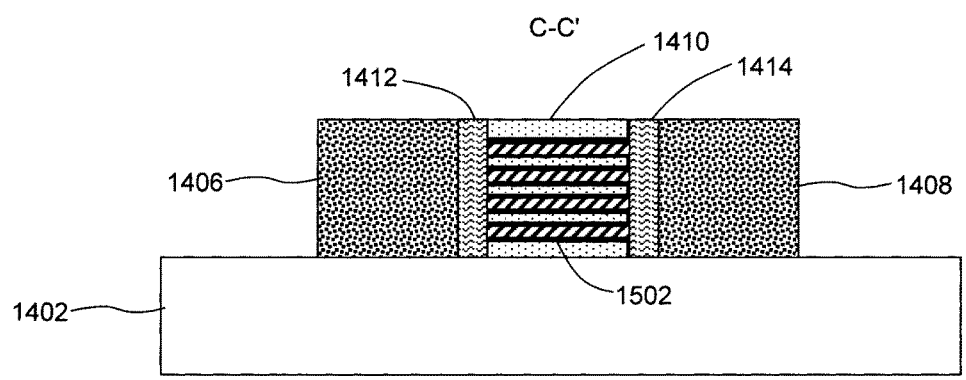
FIG. 15 is a cross-sectional view of the exemplary nanosheet transistor of FIG. 14 according to an embodiment of the present invention.

FIGS. 14 and 15 are diagrams illustrating an exemplary nanosheet transistor 1400 that can be implemented as the NFETs and/or PFETs in the present 4T SRAM bitcell design. Nanosheet transistors are devices having at least one nanosheet interconnecting a source and a drain. According to an exemplary embodiment, a stack of the nanosheets is used, which are suspended in the channel region of the device. By suspending the nanosheets in the channel region of the device, a gate-all-around configuration can be made where the gate surrounds at least a portion of each of the nanosheets in the channel region of the device.

Namely, as shown in FIG. 14, nanosheet transistor 1400 includes a stack of nanosheets 1404 over a substrate 1402 (e.g., a Si, Ge, SiGe, etc. substrate). The stack of nanosheets 1404 serves as channels interconnecting source 1406 and drain 1408. A gate is present over the channels (i.e., the channels are the portions of each of the nanosheets in the stack 1404 that are surrounded by the gate). The gate includes a gate conductor 1410 and a gate dielectric (not visible in this depiction) that separates the gate conductor 1410 from the channels. The gate is offset from the source 1406 and drain 1408 by spacers 1412 and 1414, respectively.

The source 1406 and drain 1408 are doped with either an n-type or p-type dopant depending on whether a p-channel VTFET or an n-channel VTFET is required. Suitable n-type dopants include, but are not limited to, phosphorous and arsenic, and suitable p-type dopants include, but are not limited to, boron. Thus, based on the dopants employed, nanosheet transistor 1400 can be configured to serve as the NFET and/or PFET transistors in the present 4T SRAM bitcell.

A cross-sectional view through the nanosheet transistor 1400 is provided. For instance, FIG. 15 depicts a cross-sectional cut C-C (see FIG. 14) along the stack of nanosheets 1404. As shown in FIG. 15, the stack of nanosheets 1404 extends between the source 1406 and drain 1408. According to an exemplary embodiment, the nanosheets in the stack 1404 are formed from an epitaxial material such as epitaxial Si or epitaxial SiGe. As shown in FIG. 15, the nanosheets in the stack 1404 are spaced apart from one another which permits the gate conductor 1410 to be present between the nanosheets in the stack 1404. As such, the gate conductor 1410 surrounds a portion of each of the nanosheets in the stack 1404 in a gate-all-around configuration. These portions of the nanosheets in stack 1404 surrounded by the gate conductor 1410 are the channels of the nanosheet transistor. As also shown in FIG. 15, a gate dielectric 1502 separates the gate conductor 1410 from the channels.

By way of example only, suitable gate conductors 1410 include, but are not limited to, doped poly-Si, a workfunction setting metal(s), or combinations thereof. As provided above, suitable n-type workfunction setting metals include, but are not limited to, TiN, TaN and/or Al-containing alloys such as TiAl, TiAlN, TiAlC, TaAl, TaAlN, and/or TaAlC. Suitable p-type workfunction setting metals include, but are not limited to, TiN, TaN, and W.

A silicon dioxide ($SiO_2$) gate dielectric 1502 is well suited for a poly-Si gate conductor 1410, while a high-κ gate dielectric 1502 is preferable for a metal gate conductor 1410. As provided above, suitable high-κ gate dielectrics include, but are not limited to, $HfO_2$ and/or $La_2O_3$.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A 4 transistor (4T) static random access memory (SRAM) bitcell, comprising:
    two n-channel field-effect transistors (NFETs) cross-coupled with two p-channel FETs (PFETs), wherein the NFETs are both connected directly to a word line, wherein a first one of the PFETs is connected to a first bit line via a first one of the NFETs and a second one of the PFETs is connected to a second bit line via a second one of the NFETs, wherein the PFETs are each separately connected to ground, and wherein cross-coupling between the NFETs and the PFETs comprises a first connection between only two devices which are the first PFET and the first NFET, and a second connection between only two other devices which are the second PFET and the second NFET.

2. The 4T SRAM of claim 1, wherein the NFETs and the PFETs each comprises a vertical transport field-effect transistor (VTFET).

3. The 4T SRAM of claim 2, wherein the VTFET comprises:
    at least one vertical fin channel;
    a bottom source and drain at a base of the at least one vertical fin channel;
    bottom spacers disposed on the bottom source and drain;
    a gate along sidewalls of the at least one vertical fin channel above the bottom spacers;
    top spacers above the gate at a top of the at least one vertical fin channel; and
    a top source and drain above the top spacers.

4. The 4T SRAM of claim 1, wherein the NFETs and the PFETs each comprises a fin-field-effect transistor (finFET).

5. The 4T SRAM of claim 4, wherein the finFET comprises:
    at least one fin interconnecting a source and a drain;
    a gate disposed over a portion of the at least one fin that serves as a channel of the finFET; and
    spacers offsetting the gate from the source and the drain.

6. The 4T SRAM of claim 1, wherein the NFETs and the PFETs each comprises a nanosheet transistor.

7. The 4T SRAM of claim 6, wherein the nanosheet transistor comprises:
    a stack of nanosheets interconnecting a source and a drain;
    a gate surrounding at least a portion of each of the nanosheets in the stack that serves as a channel of the nanosheet transistor; and
    spacers offsetting the gate from the source and the drain.

8. A SRAM device, comprising:
    bit lines;
    word lines oriented orthogonal to the bit lines;
    bitcells at an intersection of the word lines and bit lines, wherein each bit cell comprises two NFETs cross-coupled with two PFETs, wherein the NFETs are both connected directly to one of the word lines, wherein a first one of the PFETs is connected to a first one of the bit lines via a first one of the NFETs and a second one of the PFETs is connected to a second bit line via a second one of the NFETs, wherein the PFETs are each separately connected to ground, and wherein cross-coupling between the NFETs and the PFETs comprises a first connection between only two devices which are the first PFET and the first NFET, and a second connection between only two other devices which are the second PFET and the second NFET.

9. The SRAM device of claim 8, wherein the NFETs and the PFETs each comprises a VTFET.

10. The SRAM device of claim 9, wherein the VTFET comprises:
    at least one vertical fin channel;
    a bottom source and drain at a base of the at least one vertical fin channel;
    bottom spacers disposed on the bottom source and drain;
    a gate along sidewalls of the at least one vertical fin channel above the bottom spacers;
    top spacers above the gate at a top of the at least one vertical fin channel; and
    a top source and drain above the top spacers.

11. The SRAM device of claim 8, wherein the NFETs and the PFETs each comprises a finFET.

12. The SRAM device of claim 11, wherein the finFET comprises:
    at least one fin interconnecting a source and a drain;
    a gate disposed over a portion of the at least one fin that serves as a channel of the finFET; and
    spacers offsetting the gate from the source and the drain.

13. The SRAM device of claim 8, wherein the NFETs and the PFETs each comprises a nanosheet transistor.

14. The SRAM device of claim 13, wherein the nanosheet transistor comprises:
    a stack of nanosheets interconnecting a source and a drain;
    a gate surrounding at least a portion of each of the nanosheets in the stack that serves as a channel of the nanosheet transistor; and
    spacers offsetting the gate from the source and the drain.

15. A method of operating a SRAM device, the method comprising the steps of:
    providing the SRAM device comprising:
        bit lines;
        word lines oriented orthogonal to the bit lines;
        bitcells at an intersection of the word lines and bit lines, wherein each bit cell comprises two NFETs cross-coupled with two PFETs, wherein the NFETs are both connected directly to a given one of the word lines, wherein a first one of the PFETs is connected to a first given one of the bit lines via a first one of the NFETs forming a zero (0) node of the 4T SRAM bitcell and a second given one of the PFETs is connected to a second bit line via a second one of the NFETs forming a one (1) node of the 4T SRAM bitcell, wherein the PFETs are each separately connected to ground, and wherein cross-coupling between the NFETs and the PFETs comprises a first connection between only two devices which are the first PFET and the first NFET, and a second connection between only two other devices which are the second PFET and the second NFET;

passively retaining the zero (0) node using ground leak through the first PFET; and actively retaining the one (1) node using the second PFET.

16. The method of claim 15, further comprising the steps of:

applying a write pulse to the first given bit line and the second given bit line, the write pulse corresponding to a logic 0 or a logic 1 data state; and activating the given word line to write the data state to the bit cell.

17. The method of claim 16, wherein the write pulse is applied to the first given bit line and the second given bit line using a write driver.

18. The method of claim 16, further comprising the steps of:

floating the first given bit line and the second given bit line;

activating the given word line; and reading current Iread through the bitcell.

19. The method of claim 18, wherein the Iread through the bitcell is read using a current sense amplifier.

20. The method of claim 16, wherein the NFETs and the PFETs each comprises a VTFET, a finFET, or a nanosheet transistor.

\* \* \* \* \*